United States Patent [19]
Pfaff

[11] Patent Number: 5,419,710
[45] Date of Patent: May 30, 1995

[54] MOUNTING APPARATUS FOR BALL GRID ARRAY DEVICE

[76] Inventor: Wayne K. Pfaff, 309 Steeplechase, Irving, Tex. 75062

[21] Appl. No.: 258,348

[22] Filed: Jun. 10, 1994

[51] Int. Cl.$^6$ .......................................... H01R 11/22
[52] U.S. Cl. ..................................... 439/266; 439/71; 439/912
[58] Field of Search ................. 29/593, 832, 847–850; 439/54, 68–71, 83, 260, 263, 264, 266, 912

[56] References Cited

U.S. PATENT DOCUMENTS

| | | | |
|---|---|---|---|
| 4,420,205 | 12/1983 | Kirkman | 439/266 |
| 4,739,257 | 4/1988 | Jenson et al. | 439/263 X |
| 5,073,117 | 12/1991 | Malhi et al. | 439/912 X |
| 5,281,160 | 1/1994 | Walkup et al. | 439/266 |

Primary Examiner—Khiem Nguyen
Attorney, Agent, or Firm—Jack A. Kanz

[57] ABSTRACT

Ball grid array devices are mounted in a burn-in and test socket which has a top surface with windows for the ball terminals depending from the ball grid array device. Contact fingers mounted on the base of the socket extend through a cam plate and into the windows from the opposite side of the top surface. When the cam plate is moved laterally with respect to the top surface, the ends of the contact members are moved into contact with the ball terminals. The ends of the contact members are curved to contact the ball terminals between the center of the ball terminal and the surface of the ball grid array device, thus retaining the device in the socket.

16 Claims, 5 Drawing Sheets

MOUNTING APPARATUS FOR BALL GRID ARRAY DEVICE

Advances in microelectronics technology tend to develop device chips which occupy less space while performing more functions. As a result, the number of electrical interconnections between the chip and external circuitry required for the circuit in the chip to communicate with the outside world increases and the physical size of each such interconnection must decrease. In order to provide electrical communication between the chip and external circuitry, circuit chips are usually contained within a housing or package which supports interconnection leads, pads, etc., on one or more of its external surfaces. In order to reduce overall lead length from chip to external circuitry and to provide adequate spacing between input/output terminals on the package, high pin count devices are usually mounted in packages in which the input/output terminals are arranged in a grid pattern on one face of the package. The terminals may be in the form of pins extending from the package (usually described as a pin grid array or PGA) or contact pads on the surface of the package. To physically secure the chip to a substrate and provide electrical connection between its terminal pads and similar interconnect pads on the surface of a substrate such as a circuit board or the like on which the package is to be mounted, a small drop or ball of solder or the like is secured to each terminal pad on the device package. Since the solder drop forms a ball-like protrusion extending from the terminal pad, such devices are ordinarily described as ball grid array (or BGA) devices.

While the term "ball grid array device" is usually applied to a device package which has substantially spherical contacts extending from one face thereof, the term is also applied to other structures. For example, bare (unencapsulated) chips are sometimes provided with a grid array of ball-shaped contacts for mounting in a package. However, at some point during fabrication, the bare chip with ball-shaped contacts is fairly described as a ball grid array device. Similarly, finished chips are sometimes provided with terminal pads on one surface with ball-like deposits of solder forming interconnections on the terminal pads. The chip is then inverted and attached directly to a corresponding pattern of interconnect pads on a substrate. When heated, the solder balls reflow forming electrical and physical connections. This process (sometimes referred to as "flip-chip" technology) obviously uses devices which may be described as ball grid array devices. Accordingly, for purposes of this disclosure the term "ball grid array device" means any structure, including device packages, flip chips and bare dies, carrying a plurality of substantially ball-shaped interconnections on one face thereof which are arranged in a substantially grid-like pattern. The ball terminals are substantially spherical and are arranged on one surface of the device package in a predetermined pattern. Since the ball terminals are substantially spherical and uniform in size, each ball terminal has a geometric center which is spaced from the surface of the device package from which the ball terminal depends and the geometric centers of the ball terminals lie substantially in a plane parallel with the surface of the device package from which the ball terminals depend. This plane (or the corresponding plane for each individual ball terminal) is referred to herein as the centerline or extended centerline of the ball terminal.

Many electronic devices are subjected to testing and burn-in at some point during or after the fabrication process. For burn-in and testing, the device must be removeably mounted on a test fixture which provides electrical connection with each of the input/output terminals while the device is functionally tested and evaluated. In many cases the device is subjected to harsh environmental conditions (such as heat, etc.) as well as electrical stresses to evaluate and assure full functionality of the finished device. In order to provide for effective testing and burn-in, the fixture in which the device is mounted for testing and burn-in must permit rapid and easy insertion and removal without damage to the device, the device package or the delicate ball terminals. However, the very features of the ball grid array device which make it attractive as a device structure (i.e., closely grouped very small contacts arranged on a hidden face) make it extremely difficult to reliably mount in a test socket without damaging the device structure.

In conventional test structures the ball grid array device is positioned on an interconnect substrate having interconnect pads corresponding to the ball grid array pattern. The ball grid array device is positioned on the substrate so that the terminal balls are individually in contact with interconnect pads on the test substrate. However, to maintain the ball grid array device in the proper position and orientation for testing, a lid or cover must be used which entraps the device and maintains the ball grid array in register and contact with the interconnect pads. Unfortunately, the entrapping lid interferes with proper circulation of cooling air around the device and precludes use of heat sinks even though the device may be designed to operate only in connection with a particular heat sink. Such lids or covers are also difficult to manipulate, may cause damage to the device and generally prevent automated loading and unloading of the test sockets.

The present invention avoids the difficulties of the prior art by providing a mounting housing or socket with an open top. No lids, covers, etc., are required. Thus the top face of the device under test is available for attachment of a heat sink or open to cooling air or the like. Furthermore, since the top of the socket or mounting housing is open, devices to be tested can be inserted and removed by automated processes without fear of damaging the devices or the mounting apparatus.

The socket or mounting housing of the invention comprises a support member having a top face with a plurality of windows arranged therein to receive the array of interconnection terminal balls depending from the face of ball grid array package. The socket also includes a base member in which a plurality of axially elongated contact pins or fingers are anchored. One end of each contact finger extends through the base to provide an attachment tail which may be soldered to a burn-in board or the like. The opposite end of each finger projects into one of the windows. The upper portion of each finger (between the free end and the base) extends through an aperture in a cam plate mounted between the base and the support member. The cam plate is moveable laterally with respect to the support member to move the free ends of the contact fingers with respect to the windows. The end portion of each free end is curved or bent to define a contact tip at the extreme end of the free end which deviates from the axis of the finger. The fingers are mounted so that in the open configuration the free end portions of the contact fingers are adjacent one side of their respective windows. When a ball grid array device is positioned on the top face of the support member, the terminal balls project into the windows. A cam is used to move the cam plate laterally, thus uniformly moving the free ends of all the contact fingers in the same direction simultaneously. The end portions are thus urged into contact with the terminal balls occupying the windows. The extreme portion of each finger (which is deviated from the axis of the finger) is positioned adjacent the top of the window. Thus, when the finger is moved by the cam plate, the end contacts the terminal ball above the horizontal centerline thereof. The fingers thus provide individual electrical contact to each ball and, since they contact the balls above their centerlines (between the center of each ball and the surface from which it depends), they retain the balls in their respective windows and thus entrap the ball grid array device. Since the ball grid array device is held in place by the end portions which contact the balls above their centerlines, the size of the balls may vary within limits without affecting the trapping effect of the contact fingers. Because of the simplicity of design and operation, the socket devices of the invention may be made from a wide variety of available materials. Since the top of the socket is open, automated processes may be employed to load and unload the socket without damage to the devices or the sockets and the top surface of the device is exposed for cooling and/or attachment of a heat sink. Other features and advantages of the invention will become more readily understood from the following detailed description taken in connection with the appended claims and attached drawing in which:

The terms "mounting housing" and "socket" are used synonymously herein to describe a device or apparatus for holding a ball grid array device while providing electrical contact to each of its terminal balls. For clarity of illustration, like numerals are applied to like parts throughout the drawing.

Figure 1B:
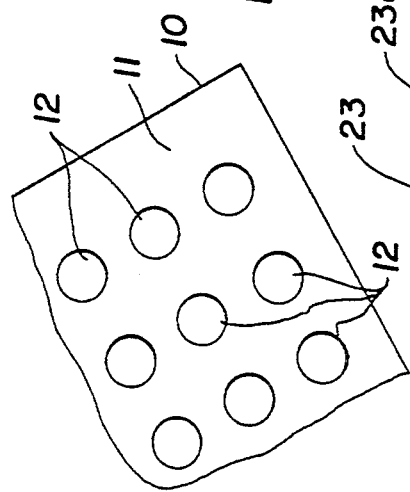
FIG. 1B is an exaggerated fragmentary view of the ball grid array surface of the ball grid array device of FIG. 1.
Figure 1A:
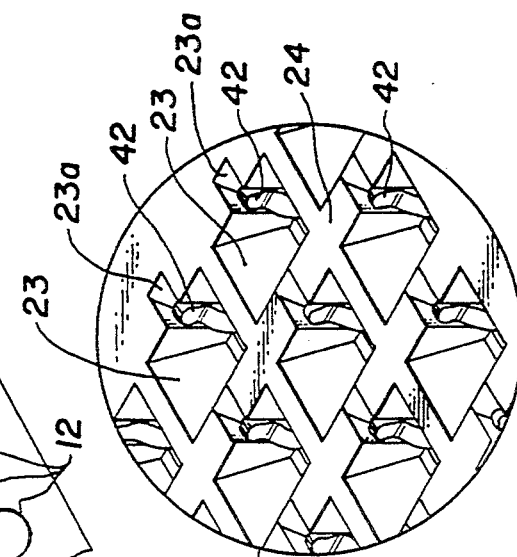
FIG. 1A is an exaggerated fragmentary view of the top surface of the mounting housing of FIG. 1.
Figure 1:
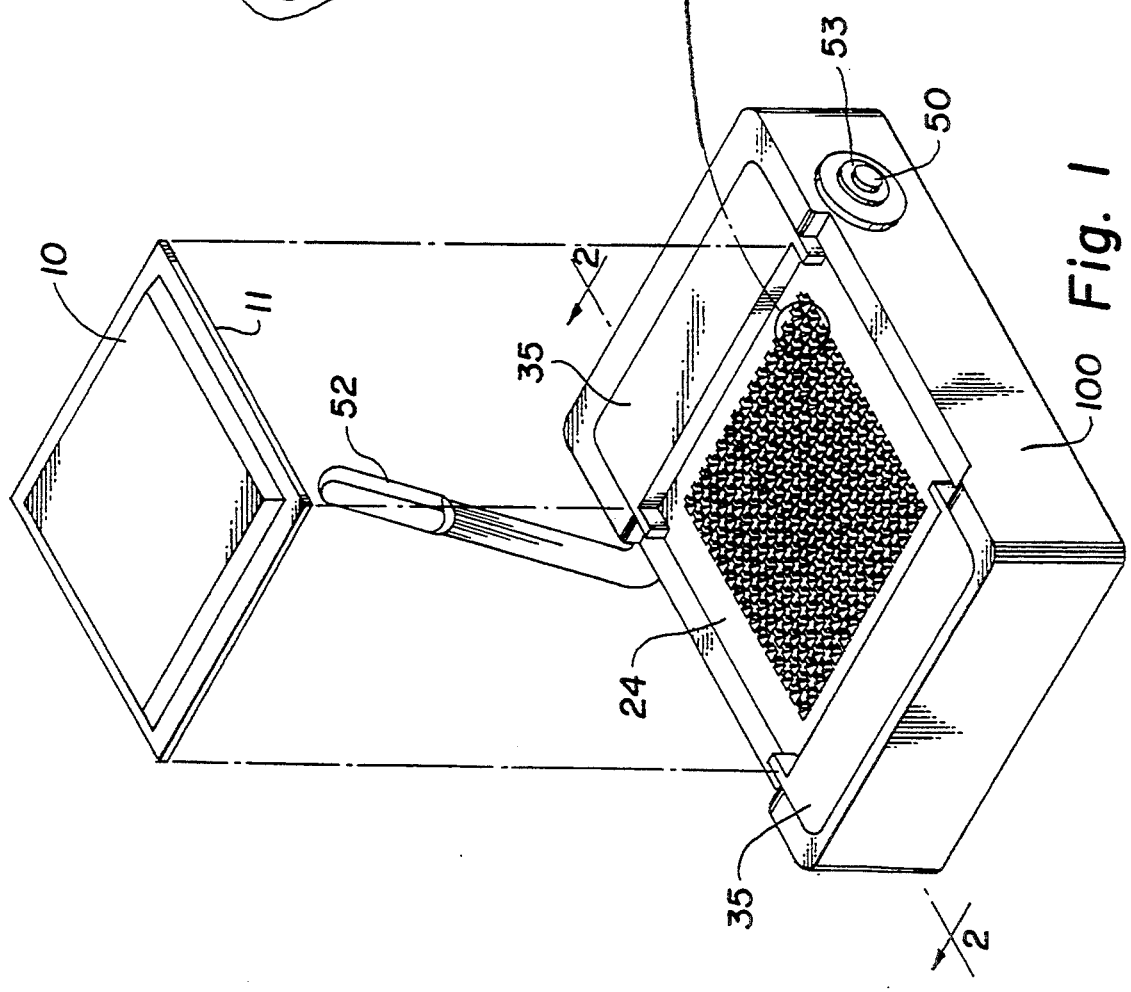
FIG. 1 is an exploded perspective view of the assembly of a ball grid array device with a preferred embodiment of the mounting housing of the invention.

Operational arrangement of a ball grid array device 10 with the mounting housing of the invention is illustrated in FIG. 1. The ball grid array of device 10 has a bottom surface 11 (see FIG. 1B) on which are formed a plurality of spherically-shaped terminals 12. The terminals 12 are formed by depositing solder at predetermined locations on mounting pads or the like (not illustrated) on the face 11 of the device. Various methods for forming such terminal balls are known and form no part of this invention. However, the various processes are known to produce substantially spherical bodies (see FIG. 5) which depend from the lower face 11 of the ball grid array device. The terminal balls 12 are usually solder which has been deposited and heated so that it contracts into a ball shape by surface tension. Regardless of the method of manufacture, for reference purposes the ball-shaped terminals extending from the face of the ball grid array device are referred to herein as terminal balls or ball terminals.

Terminal balls 12 are arranged on the lower face of ball grid array device 10 in a predetermined grid-like pattern. To accommodate the ball grid array device, the mounting housing of the invention employs a top support member 22 which has a plurality of windows 23 extending therethrough. The windows 23 are arranged in a grid pattern matching the grid pattern of the ball terminals 12. To accommodate ball grid array devices of different dimensions, the top face 24 of support member 22 may be provided with removeable spacers 35 of various sizes. The spacers 35 define the periphery of each particular ball grid array device and position the ball grid array device to prevent movement thereof laterally with respect to top face 24. Spacers 35 therefore assure that each ball grid array is aligned with the ball terminals 12 depending from the lower face 11 thereof in proper registry and orientation with windows 23 and may be changed as required for each size and shape of ball grid array device package.

Figure 2:
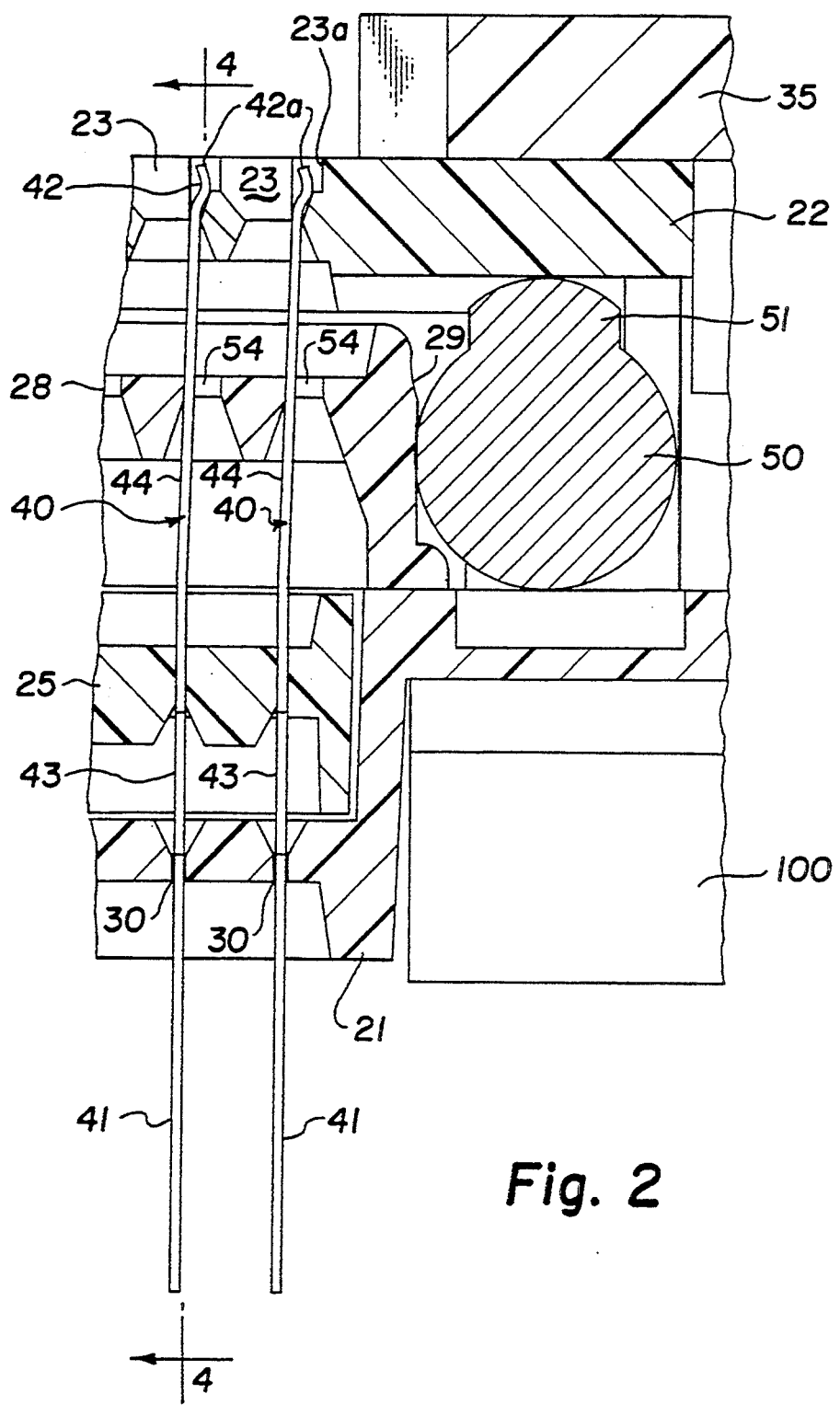
FIG. 2 is a partial sectional view of the mounting housing device of FIG. 1 taken along lines 2—2 showing the position of the contact fingers when the mounting housing is in the open condition.
Figure 3:
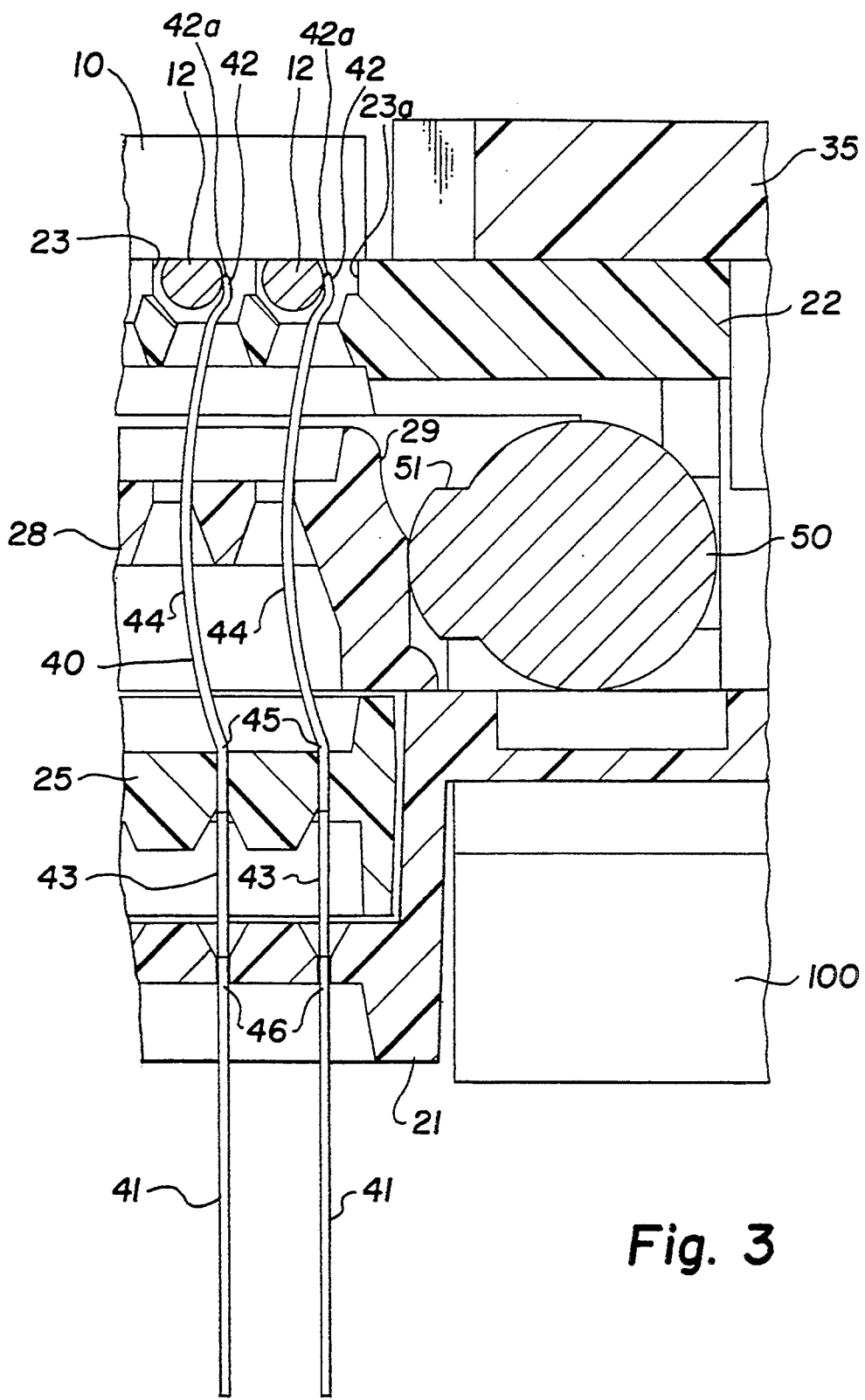
FIG. 3 is a partial sectional view of the mounting housing of FIG. 1 taken along lines 2—2 showing the position of the contact fingers when a ball grid array has been inserted in a socket and the socket is in the closed position.
Figure 4:
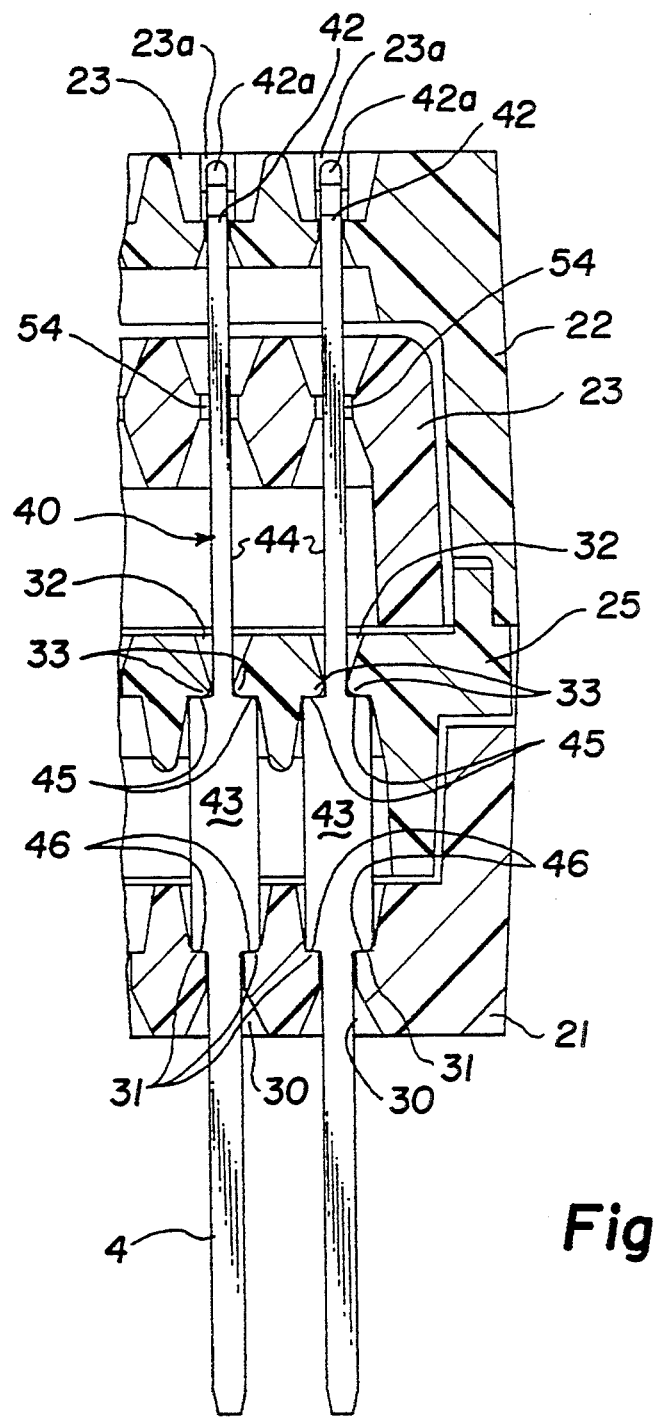
FIG. 4 is a partial sectional view of the mounting housing of FIG. 1 taken along lines 4—4 of FIG. 2.

In the preferred embodiment illustrated in FIG. 1 the socket of the invention is formed of a plurality of plate-like components (described in detail hereinafter) contained within a unitary box-like housing 100 having an open top and open bottom. As best illustrated in FIGS. 2, 3 and 4, the housing contains a base member 21 which has a plurality of apertures 30 therein positioned substantially in registry with windows 23 in support member 22. Each aperture 30 has an internal shoulder 31 (see FIG. 4). An elongated contact finger 40 is positioned in each aperture 30. In the preferred embodiment, each elongated contact finger defines an axially elongated body of resilient electrically conductive material such as nickel-coated steel or the like. The mid-section 43 of each contact finger 40 is substantially widened to form shoulders 45 and 46 on opposite ends thereof. Accordingly, when contact fingers 40 are inserted in the base member 21, tail portions 41 project through apertures 30 and shoulders 46 rest on shoulders 31. Trap plate 25 having apertures 32 and shoulders 33 in registry with and corresponding to apertures 30 is secured to base member 21 and shoulders 33. The upper portion 44 of each contact finger 40 extends through an aperture 32 and the shoulders 33 on aperture 32 contact shoulders 45 on the expanded mid-sections 44 of the contact fingers. Accordingly, the contact fingers 40 are securely entrapped and held in place in the base member 21 by trap plate 25.

The lower ends of the contact fingers 40 extend from the lower face of base support 22 to define input/output tails 41. Tails 41 may be secured in a suitable circuit board, burn-in board or the like. Alternatively, other means for making electrical contact to the circuitry of the supporting medium may be used.

The upper portion 44 of each contact finger 40 which extends above the mid-section 43 projects through an aperture 54 in cam plate 28 with its free end 42 terminating in window 23. In the preferred embodiment, the free end portion 42 of each finger 40 is sufficiently elongated to define a generally central axis which is substantially perpendicular to the support surface 24 and extends into a window 23. The extreme end 42a, however, is bent or curved to deviate from the central axis and extends into the window 23 toward the support surface 24 but does not extend through the window 23 or surface 24. For best results, the extreme end 42a should extend as near the surface 24 as possible without extending therethrough. It is only necessary, however, that the extreme end 42a be above the centerline of the ball terminal which is contacts.

In the preferred embodiment, each window 23 has a small recess 23a which accommodates the end portion 42 of contact finger 40. As illustrated in FIGS. 2, 3 and 4, a cam plate 28 is positioned between trap plate 25 and support member 22 but is free for reciprocal movement laterally with respect to the housing. Since mid-sections 43 of contact fingers 40 are securely anchored between the base member 21 and trap plate 25, lateral movement of cam plate 28 causes corresponding lateral movement of the free end portions 42 of contact fingers 40.

Rotatable cam 50 extends horizontally through the mounting housing adjacent one end surface 29 of the cam plate. The cam 50 is secured in housing 100 on one end by retainer 53. The opposite end of the cam 50 is controlled by lever 52. A lobe 51 extending from cam 50 is moved into contact with end surface 29 of cam plate 28 when lever 52 is moved in a first direction. Thus rotation of a cam 50 (counter-clockwise as shown in FIG. 2) urges cam plate 28 in the same direction (to the left as shown in FIG. 2). Movement of cam plate 22 thus forces the free end portions 42 in the same direction, withdrawing them from recesses 23a and causing them to traverse the window 23. It should be recognized that a rotating cam 50 is the presently preferred means for moving cam plate 28. Other means such as wedge plates, ratchets, plungers and rack-and-pinion arrangements, to name a few, may be designed to perform the relative movement function of the cam. Thus the terms "cam" and "cam plate" are used herein to describe any mechanical arrangement which moves the upper portion 44 of the contact fingers laterally with respect to the support member 22.

The position of the upper portions 44 of contact fingers 42 in the housing in the open condition is illustrated in FIG. 2. In this position the contact fingers 40 are either relaxed or forced into the open position by cam plate 28. If desired, a spring (not shown) may be positioned between the housing 100 and the end of the cam plate 28 opposite end 29 to ensure that the free end portions 42 are withdrawn into recesses 23a. Accordingly, a ball grid array device may be positioned with the ball terminals 12 depending into windows 23 by simply positioning the ball grid array in the proper position. Since the free end portions 42 are withdrawn into recesses 23a, the ball terminals 12 simply depend into windows 23. Thus, no pressure of any sort is applied to any portion of the ball grid array device 10 or the depending ball terminals 12. Furthermore, no force is applied (other than gravitational) to any portion of the socket by the electronic device package or the ball terminals. When the ball grid array device is securely in place, lever 52 is moved to rotate cam 50 and urge lobe 51 into contact with the end surface 29 of cam plate 28. As cam plate 28 is moved (to the left as shown in FIG. 2) by lobe 51, the free end portions 42 of the contact fingers 40 uniformly and simultaneously move toward and into contact with the ball terminals 12 depending into the windows 23.

Figure 5:
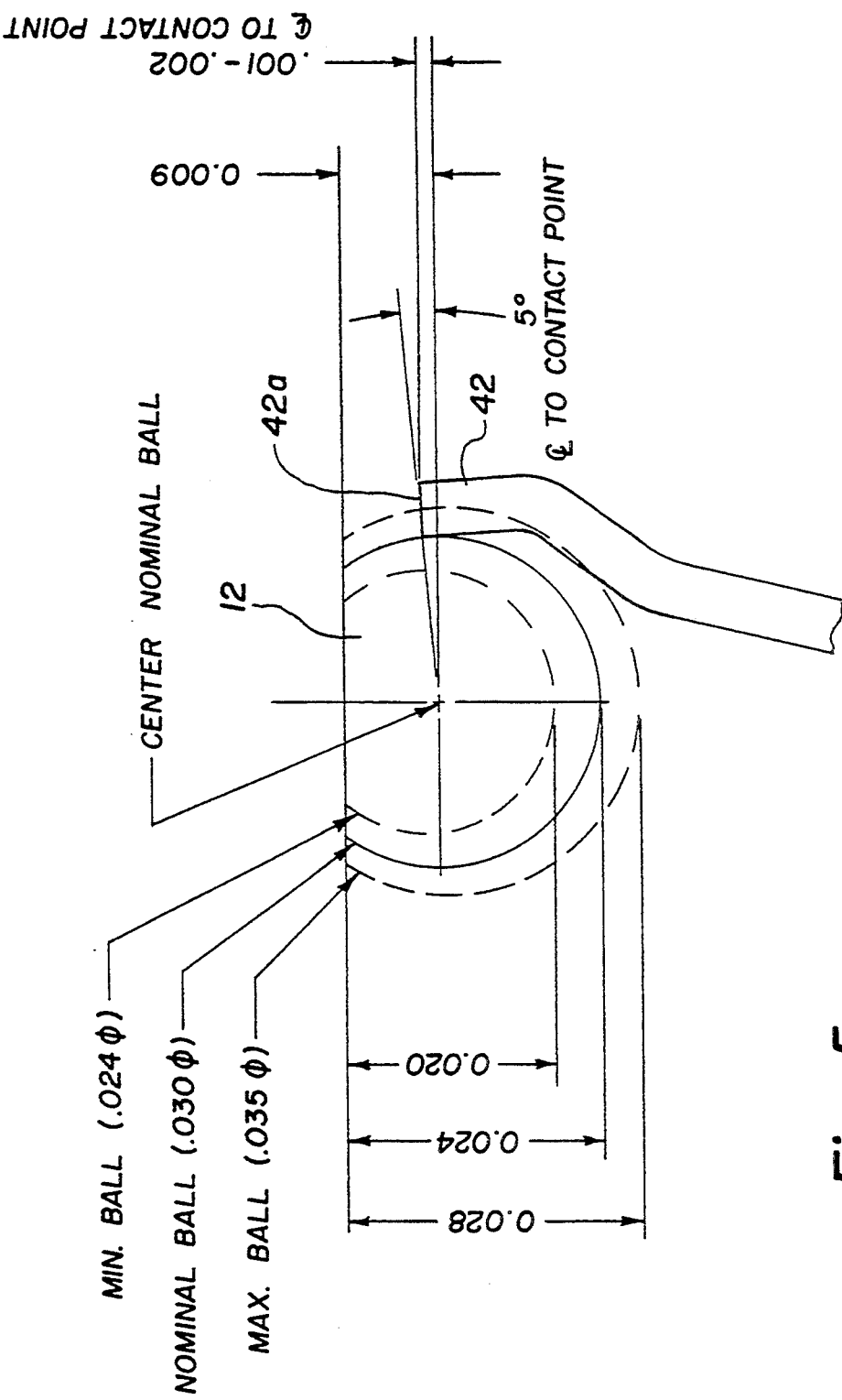
FIG. 5 is a diagrammatic representation of the relationship between the end portion of a contact finger as used in the invention and terminal balls of various nominal ball sizes extending from the surface of ball grid array device.

As best shown in FIG. 1A and graphically illustrated in FIG. 5, the free end portions 42 of contact fingers 40 are positioned to extend into windows 23 near surface 24 but do not extend above surface 24. Furthermore, the free end portions 42 are bent so that the extreme end 42a deviates from the vertical axis of the pin 40 toward the ball terminal 12 to form a cup or hook at the extreme end 42a of the contact finger 40. As illustrated in FIG. 5, the extreme end 42a of free end portion 42 must extend above the centerline of the ball terminal 12. For representative purposes, FIG. 5 illustrates the relative position of extreme end 42a in contact with a ball terminal when the nominal ball size is 0.030 inch. Nominal ball sizes of 0.030 inch may vary from about 0.035 to about 0.024 inch in diameter. Thus the point of contact on the ball may vary slightly with variations in ball size. However, as shown in FIG. 5, where the extreme end 42a of free end portion 42 extends at least 0.001 to about 0.002 inch above the extended centerline (the horizontal line passing through the center of the ball terminal 12), the point of contact between the extreme end 42a of contact finger 40 will be approximately five degrees (5°) above the extended centerline of the ball terminal 12. Thus, since the ball grid array device 10 is trapped and prevented from horizontal movement by spacers 35, pressure exerted against the ball terminals 12 by extreme ends 42a of the contact fingers 40 have both a lateral force component and a small downward force component. The ball grid array device 10 is thus trapped and secured against the top face 24 of the support member 22 by the lateral and downward pressure exerted on the ball terminal 12 by contact fingers 40.

The relative positions of the components of the mounting housing and the ball grid array device when the housing is in the closed condition is illustrated in FIG. 3. Note that lobe 51 on cam 50 has forced cam plate 28 to the left as shown in FIG. 3. The extreme ends 42a of contact fingers 40 have moved in the same direction until they contact the surface of ball terminals 12. As the cam plate 28 moves further to the left, the mid-section 44 of each contact finger 40 is bowed until a contact pressure of approximately thirty-five (35) grams is applied to each ball terminal. Since the extreme end 42a of the contact finger 40 is above the centerline of each of ball terminal 12, this pressure securely locks the entire ball grid array device adjacent the top surface 24 of the mounting housing and each contact finger 40 is in electrical contact with a ball terminal 12 for electrical function testing, etc. However, a pressure in the range of about thirty-five (35) grams is insufficient to damage or dislodge the ball terminals 12. After testing, burn-in or other procedures have been applied to the ball grid array device 10, the device is released by merely moving lever 52 in the opposite direction, permitting the contact fingers 40 (and springs, if included) to urge cam plate 28 in the opposite direction and permitting the extreme ends 42a to withdraw into recesses 23. The apparatus of the invention therefore provides a totally zero insertion force socket for mounting ball grid array devices for testing and burn-in. The test device may be simply inserted into the top face of the mounting housing by gravity. No force of any sort is applied to the device package or the ball terminals 12 during insertion or removal.

When the socket is in the closed position, the extreme ends 42a of the contact fingers 40 each exert a lateral and downward force on the ball terminal at approximately five degrees (5°) above its centerline. The pressure exerted by each individual finger is limited so that there is no risk of damage to the ball terminals 12. Likewise, when the contact fingers 40 are withdrawn to the open position, the ball grid array device 10 may be removed simply by gravity or with a vacuum pencil or the like. It is particularly noteworthy that the invention not only permits total zero insertion force and withdrawal force, no pressure whatsoever is ever applied to the ball grid array device except to the terminal balls 12. In fact, the entire top surface of the ball grid array device is exposed since no lid or cover is employed. Cooling air may be circulated thereover or a heat sink may be applied thereto. Furthermore, since test devices may be loaded simply by vertical movement by gravity, the test apparatus of the invention may be easily loaded and unloaded by automated equipment.

It will be readily recognized that the materials used for manufacture of the mounting housing invention may be varied as desired, depending upon the application. Similarly, the physical size and shape of the components may be arranged to accommodate any particular ball grid array device. For example, the contact fingers 40 are shown as axially elongated metal strips as may be cut or stamped from flat ribbon stock. However, the fingers 40 could be formed from wire stock and may be formed into various configurations without departing from the principles of the invention. Likewise, the fingers may be anchored in the socket as desired by any other suitable means. If the socket is to be used for burn-in purposes, heat resistant materials, of course, should be employed. The design is particularly attractive for use in hostile environments since, in its preferred embodiment, very few moving parts are employed and the opening and closing function can be readily automated. Thus the preferred structure is extremely reliable and functional in extended repetitive use.

From the foregoing it will be recognized that the principles of the invention may be employed in various arrangements to obtain the benefit of the many advantages and features disclosed. It is to be understood, therefore, that even though numerous characteristics and advantages of the invention have been set forth together with details of the structure and function of the invention, this disclosure is to be considered illustrative only. Various changes and modifications may be made in detail, especially in matters of size, shape and arrangements of parts, without departing from the spirit and scope of the invention as defined by the appended claims.

What is claimed:

1. Apparatus for mounting a ball grid array device comprising:
   (a) a support member having a support face with a plurality of windows therein arranged in a pattern to correspond with and receive ball terminals depending from the face of a ball grid array device when said ball grid array device is positioned on the support face of said support member;
   (b) a base member;
   (c) a cam plate having apertures therein substantially corresponding with said windows positioned between said base member and said support member and adapted for lateral movement with respect to said base member and said support member;
   (d) a cam adapted to move said cam plate laterally with respect to said base member and said support member;
   (e) a plurality of elongated contact members anchored in said base member, each having an interconnection end and a free end portion disposed on opposed sides of a central section with said central section projecting through an aperture in said cam plate and said free end portion positioned in a window in said support member.

2. Apparatus as defined in claim 1 wherein said free end portion of each of said contact members has a generally central axis and the extreme end of said end portion is deviated from said generally central axis.

3. Apparatus as defined in claim 2 wherein each said extreme end portion extends into a window in the support member but does not extend through said window.

4. Apparatus as defined in claim 2 wherein the extreme end of said free end portion of each of said contact members extends into a window in said support member a sufficient distance to contact a ball terminal positioned in said window between the center of the ball terminal and the surface from which such ball terminal depends.

5. Apparatus as defined in claim 1 further comprising spring means to urge said cam plate laterally with respect to said base member and said support member.

6. Apparatus as defined in claim 1 further comprising spacers removeably affixed adjacent said support face to at least partially define the periphery of a ball grid array device to be positioned on said support face.

7. Apparatus for mounting a ball grid array device comprising:
   (a) a support member having a support face with a plurality of windows therein arranged in a pattern to correspond with and receive ball terminals depending from the face of a ball grid array device when said ball grid array device is positioned on the support face of said support member;
   (b) a base member;
   (c) biasing means having apertures therein substantially corresponding with said windows positioned between said base member and said support member and adapted for lateral movement with respect to said support member;
   (d) means for moving said biasing means laterally with respect to said base member and said support member; and
   (e) a plurality of elongated contact members anchored in said base member, each having an interconnection end and a free end portion disposed on opposed sides of a central section with said central section projecting through an aperture in said biasing means and said free end portion defining a generally central axis with the extreme end portion of said free end portion deviated from said central axis and positioned in a window in said support member.

8. Apparatus as defined in claim 7 wherein each said extreme end portion extends into a window in the support member but does not extend through said window.

9. Apparatus as defined in claim 7 further comprising spacers removeably affixed adjacent said support face to at least partially define the periphery of a ball grid array to be positioned on said support face.

10. The combination comprising:
(a) a ball grid array device having a first surface and a plurality of ball terminals depending from said first surface in a predetermined pattern, each of said ball terminals defining a geometric center spaced from said first surface; and
(b) mounting apparatus comprising:
(i) a support member having a support face with a plurality of windows therein arranged in a pattern to correspond with and receiving said ball terminals depending from said first surface of said ball array device;
(ii) a base member;
(iii) a cam plate having apertures therein substantially corresponding with said windows positioned between said base member and said support member and adapted for lateral movement with respect to said support member;
(iv) means for moving said cam plate laterally with respect to said support member;
(v) a plurality of elongated contact members, each having an interconnection end and a free end portion disposed on opposite sides of a central section with said central section projecting through an aperture in said cam plate and said free end portion positioned in one of said windows in said support member and terminating between said first surface of said ball grid array and the geometric center of a ball terminal.

11. The combination defined in claim 10 wherein said free end portion of each of said contact members has a generally central axis and the extreme end of said end portion is deviated from said generally central axis.

12. The combination defined in claim 11 wherein each said extreme end portion extends into a window in the support member but does not extend through said window.

13. The combination defined in claim 10 wherein said means for moving said cam plate comprises a rotatable cam adjacent one end of said cam plate which, when rotated, coacts with one end of said cam plate to move said cam plate laterally with respect to said support member.

14. The combination defined in claim 10 wherein said means for moving said cam plate includes spring positioned to urge said cam plate laterally with respect to said support member.

15. A method of mounting a ball grid array device having a plurality of ball terminals extending from one face thereof comprising the steps of:
(a) providing a support plate with a top surface and a plurality of windows therein arranged in a preselected pattern;
(b) positioning one end of an elongated contact member in and adjacent one side of each of said windows;
(c) positioning a ball grid array device on said top surface with said ball terminals depending into said windows; and
(d) moving said one end of each of said elongated contact members into contact with the ball terminal depending into the window occupied by the end of such contact member, thereby holding said ball grid array device against said top surface.

16. A method as set forth in claim 15 including the step of defining at least a portion of the periphery of the ball grid array device positioned on said top surface with a spacer removeably affixed adjacent said top surface.

* * * * *

UNITED STATES PATENT AND TRADEMARK OFFICE
CERTIFICATE OF CORRECTION

PATENT NO. : 5,419,710
DATED : May 30, 1995
INVENTOR(S) : Wayne K. Pfaff It is certified that error appears in the above-identified patent and that said Letters Patent is hereby corrected as shown below:

Column 1, line 5    insert ---This invention relates to electronic device mounting and testing apparatus. More particularly, it relates to socket apparatus for holding and making electrical contact with the input/output terminals of ball grid array devices during testing, burn-in and the like.---

Signed and Sealed this

Twenty-sixth Day of September, 1995

Attest:

BRUCE LEHMAN

*Attesting Officer*      *Commissioner of Patents and Trademarks*